United States Patent
Kim et al.

(10) Patent No.: US 8,420,987 B2
(45) Date of Patent: Apr. 16, 2013

(54) THERMISTOR WITH 3 TERMINALS, THERMISTOR-TRANSISTOR, CIRCUIT FOR CONTROLLING HEAT OF POWER TRANSISTOR USING THE THERMISTOR-TRANSISTOR, AND POWER SYSTEM INCLUDING THE CIRCUIT

(75) Inventors: Bongjun Kim, Daejeon (KR); Giwan Seo, Incheon (KR); Hyun Tak Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 535 days.

(21) Appl. No.: 12/608,054

(22) Filed: Oct. 29, 2009

(65) Prior Publication Data

US 2010/0122976 A1    May 20, 2010

(30) Foreign Application Priority Data

Nov. 18, 2008  (KR) .................. 10-2008-0114756
Dec. 19, 2008  (KR) .................. 10-2008-0130448
Jan. 13, 2009  (KR) .................. 10-2009-0002731

(51) Int. Cl.
*H05B 1/00*    (2006.01)
*H01L 29/66*   (2006.01)

(52) U.S. Cl.
USPC ..... 219/501; 257/252; 257/467; 257/E29.347

(58) Field of Classification Search .................. None
See application file for complete search history.

(56) References Cited

U.S. PATENT DOCUMENTS

| | | | | |
|---|---|---|---|---|
| 4,316,080 A | * | 2/1982 | Wroblewski | 219/505 |
| 4,424,507 A | | 1/1984 | Nagai et al. | |
| 5,763,929 A | * | 6/1998 | Iwata | 257/467 |
| 6,147,330 A | * | 11/2000 | Ikeda et al. | 219/505 |

FOREIGN PATENT DOCUMENTS

| | | |
|---|---|---|
| JP | 10-208904 A | 8/1998 |
| JP | 2003-188336 A | 7/2003 |
| KR | 20020012664 A | 2/2002 |

* cited by examiner

*Primary Examiner* — Hoai V Ho
*Assistant Examiner* — James G Norman
(74) *Attorney, Agent, or Firm* — Rabin & Berdo, P.C.

(57) ABSTRACT

Provided are a thermistor with 3 terminals, a thermistor-transistor including the thermistor, a circuit for controlling heat of a power transistor using the thermistor-transistor, and a power system including the circuit. The circuit includes: a thermistor-transistor which comprises a thermistor having a resistance decreasing with an increase in temperature and a control transistor connected to the thermistor; and at least one power transistor which is connected to a driving device to control a supply of power to the driving device, wherein the thermistor-transistor is adhered to one of a surface and a heat-emitting part of the at least one power transistor and is connected to one of a base, a gate, a collector, and a drain of the at least one power transistor to decrease or block a current flowing in the at least one power transistor when the temperature of the at least one power transistor rises, so as to prevent the power transistor from heating up.

21 Claims, 11 Drawing Sheets

THERMISTOR WITH 3 TERMINALS, THERMISTOR-TRANSISTOR, CIRCUIT FOR CONTROLLING HEAT OF POWER TRANSISTOR USING THE THERMISTOR-TRANSISTOR, AND POWER SYSTEM INCLUDING THE CIRCUIT

CROSS-REFERENCE TO RELATED PATENT APPLICATION

This application claims the benefit of Korean Patent Application No. 10-2008-0114756, filed on Nov. 18, 2008, Korean Patent Application No. 10-2008-0130448, filed on Dec. 19, 2008, and Korean Patent Application No. 10-2009-0002731, filed on Jan. 13, 2009, in the Korean Intellectual Property Office, the disclosures of which are incorporated herein in their entireties by reference.

BACKGROUND OF THE INVENTION

1. Field of the Invention

The present invention relates to a thermistor, and more particularly, to a transistor heat controlling circuit for preventing a power transistor from heating up using a semiconductor thermistor, and an application circuit of the transistor heat controlling circuit.

2. Description of the Related Art

A thermistor is a temperature sensor that uses temperature dependency of a semiconductor, i.e., a representative semiconductor sensor device, which has been most widely used since semiconductors first appeared. The temperature dependency indicates that the resistance of the thermistor exponentially decreases with an increase in temperature. A commonly used thermistor with 2 terminals is formed of ceramic and solder, and a diode using a Si p-n junction is installed as a substitute for a thermistor in an integrated circuit (IC).

A thin-film-type thermistor is accurate from room temperature to at least 200° C. or more and is of micro-miniature size. A chip-type thermistor device may be manufactured using a temperature-sensitive package so as to be conveniently used.

Since a power transistor supplies power, the power transistor generates a large amount of heat due to over-current, which is preventable by a thermistor. However, if the thermistor is adhered to a base of the power transistor, the thermistor functions as a temperature sensor, and thus high current does not flow into the thermistor. If high current flows in the thermistor, the temperature of the thermistor rises and thus the thermistor is not accurate.

Also, if a transistor is adhered to the base of the power transistor, a p-n junction of the transistor does not greatly depend on temperature, and the resistance of the base of the power transistor is high. As a result, a power controlling effect of the power transistor is not high.

A controlling method using a thermistor operating with a temperature and a transistor operating with a voltage requires a comparator and a precise reference voltage. Therefore, an IC becomes complicated.

SUMMARY OF THE INVENTION

The present invention provides a thermistor with 3 terminals, a thermistor-transistor including the thermistor, a circuit for controlling heat of a power transistor using the thermistor-transistor, and a power system including the circuit.

According to an aspect of the present invention, there is provided a thermistor with 3 terminals, wherein the resistance of the thermistor decreases with an increase in temperature, including: a substrate; a metal heat-emitting electrode which is formed on a lower surface of the substrate to transmit heat; a thermistor thin-film which is formed on a central portion of an upper surface of the substrate; and first and second electrodes which are formed on parts of the upper surface of the substrate on both sides of the thermistor thin-film.

The thermistor may further include an insulating buffer layer which is formed between the substrate and the thermistor thin-film. The thermistor may further include a thermistor protecting insulating layer which is formed on a part of the thermistor thin film and parts of the first and second electrodes in order to protect the thermistor thin film. The thermistor thin film may be formed of a semiconductor which includes group III+V semiconductors, group II+V semiconductors, graphene and carbon nano-tubes as a carbon compound, a p-n junction diode, SiGe, ZnO, $V_2O_5$, p-type GaAs, or p-type Ge. The thermistor thin film may have a structure in which one rectangular band is connected between the first and second electrodes or at least two rectangular bands are connected between the first and second electrodes in parallel. The thermistor may be packaged in a 3-terminal chip, wherein the metal heat-emitting electrode and the first and second electrodes are respectively connected to the 3 terminals of the chip, which are exposed outside the 3-terminal chip.

According to another aspect of the present invention, there is provided a thermistor-transistor connected to one of a base, a gate, a collector, and a drain of a power transistor connected to a driving device so as to control a current of the power transistor, including: a thermistor which has a resistance decreasing with an increase in temperature; and a control transistor which is connected to the thermistor.

The thermistor may be formed using a p-n junction of a junction transistor. The control transistor may be a NPN-type junction transistor, a PNP-type junction transistor, or a metal-oxide semiconductor (MOS) transistor. The thermistor-transistor may be formed in a one-chip structure in which the thermistor and the control transistor are integrated into one chip.

According to another aspect of the present invention, there is provided a thermistor-transistor including: a thermistor which is formed using a p-n junction of a junction transistor and has a resistance decreasing with an increase in temperature; and a control transistor which is connected to the thermistor, wherein the junction transistor is a power transistor which is connected to a driving device to supply and control a current.

According to another aspect of the present invention, there is provided a circuit for controlling heat of a power transistor, including: a thermistor-transistor which includes a thermistor having a resistance decreasing with an increase in temperature and a control transistor connected to the thermistor; and at least one power transistor which is connected to a driving device to control a supply of power to the driving device, wherein the thermistor-transistor is adhered to one of a surface and a heat-emitting part of the at least one power transistor and is connected to one of a base, a gate, a collector, and a drain of the at least one power transistor to decrease or block a current flowing in the at least one power transistor when the temperature of the at least one power transistor rises, so as to prevent the at least one power transistor from heating up.

The at least one power transistor may include a NPN-type junction transistor, a PNP-type junction transistor, a MOS transistor, a photodiode (or a photo transistor) using light incident onto a base terminal, a photo relay, a photo SCR (silicon controlled rectifier), an IGBT (insulated-gate bipolar transistor), a SCR, or a triac. If the at least one power transistor is a junction transistor, the thermistor-transistor may be connected between a base and an emitter of the at least one power transistor or between a collector and the emitter of the at least one power transistor, or if the at least one power transistor is a MOS transistor, the thermistor-transistor may be connected between a gate and a source of the at least one power transistor or between a drain and the source of the at least one power transistor.

The circuit may include two power transistors which have opposite polarities and are connected to each other through a common base or a common gate, wherein the thermistor-transistor is commonly connected between one of the common base and the common gate and output terminals of the two power transistors, a first power transistor of the two power transistors is turned on to supply a current to the driving device, a second power transistor remains off, the thermistor-transistor decreases or blocks the current of the first power transistor when the temperature of the first power transistor rises, and the second power transistor is turned on to allow the current to flow so as to prevent the first power transistor from heating up. A trigger transistor may be connected to a base of the second power transistor.

According to another aspect of the present invention, there is provided a circuit for controlling heat of a power diode, including: the power diode which includes a first power diode and at least one second power diode connected to the first power diode in parallel; and a current controlling device which is connected between the first power diode and the at least one second power diode, wherein a portion of large current flowing in the first power diode flows to the at least one second power diode through the current controlling device so as to control heat of the first power diode.

According to another aspect of the present invention, there is provided a power system comprising one of the circuits.

The power system may be a power controlling circuit of a cellular phone, a computer, a battery charging circuit, a motor controlling circuit, a power amp, and an electrical and electronic device or a control circuit system of a power supply, an IC (integrated circuit), an LED light bulb, an LED fluorescent lamp, and an LED illumination.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
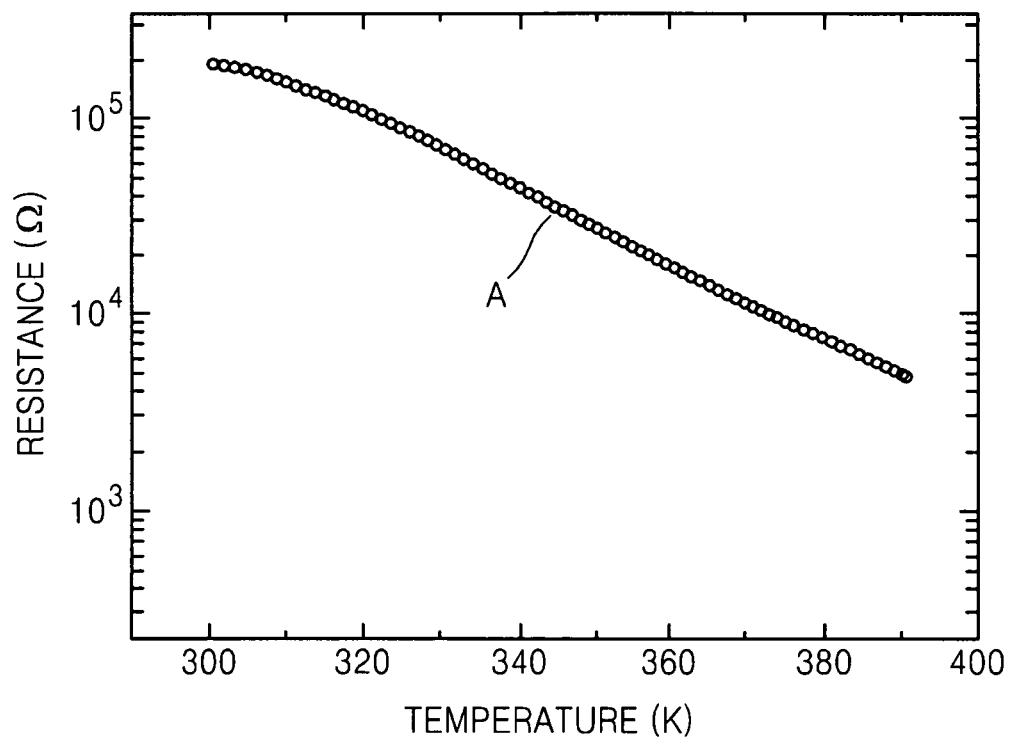
FIG. 1 is a graph illustrating a temperature dependency of the resistance of a Be-doped GaAs thin film used in a thermistor with 3 terminals, according to an embodiment of the present invention.

The present invention now will be described more fully hereinafter with reference to the accompanying drawings, in which embodiments of the invention are shown. It will be understood that when an element such as a layer, region or substrate is referred to as being "on" or extending "onto" another element, it can be directly on or extend directly onto the other element or intervening elements may also be present. It will also be understood that when an element is referred to as being "connected" or "coupled" to another element, it can be directly connected or coupled to the other element or intervening elements may be present. In the drawings, the thickness and size of elements are exaggerated for clarity, and descriptions of elements not relating to the description of the present invention are omitted. Like numbers refer to like elements throughout. The terminology used herein is for the purpose of describing particular embodiments only and is not intended to be limiting of the invention.

FIG. 1 is a graph illustrating a temperature dependency of the resistance of a Be-doped GaAs thin-film used in a thermistor with 3 terminals, according to an embodiment of the present invention. As shown with reference character "A" of FIG. 1, the resistance of the Be-doped GaAs thin film exponentially decreases with an increase in temperature. A thermistor having a resistance decreasing in inverse proportion to temperature is referred to as a negative temperature coefficient (NTC) thermistor. In the present invention, such a NTC thermistor is used in a thermistor-transistor for controlling the temperature of a power transistor, as will be described in more detail later with reference to FIG. 4.

In the present embodiment, the Be-doped GaAs thin film having the resistance depending on temperature is used as the thermistor. However, any type of thin film material having a NTC characteristic may be used to manufacture a thermistor. For example, a p-n junction diode or a p-n junction part between a base and an emitter of a transistor may be used as a thermistor, as will be described in more detail later with reference to FIG. 3.

Figure 2A:
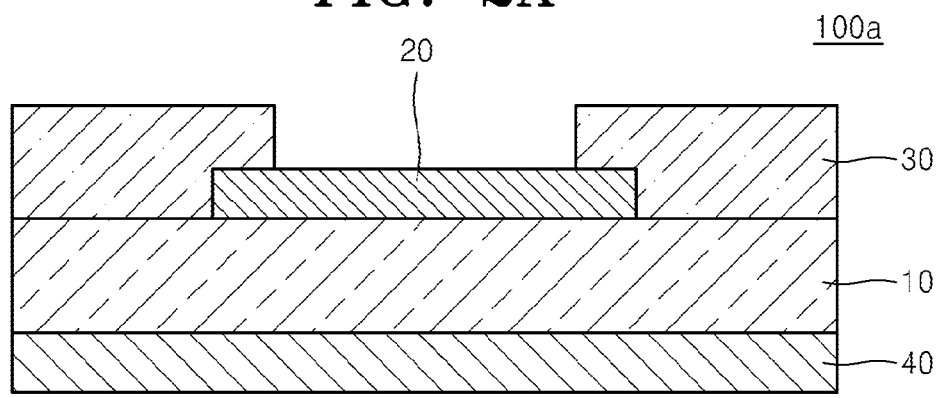
FIGS. 2A through 2C are cross-sectional views of thermistors with 3 terminals, according to embodiments of the present invention.
Figure 2B:
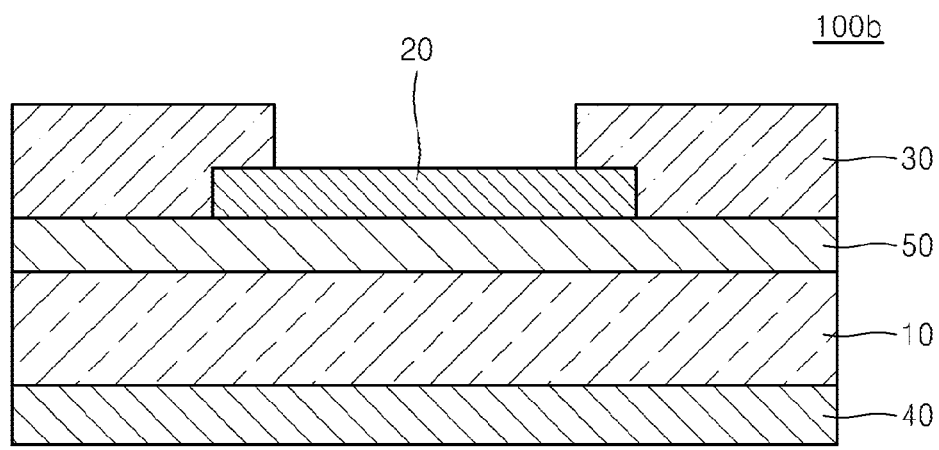
Figure 2C:
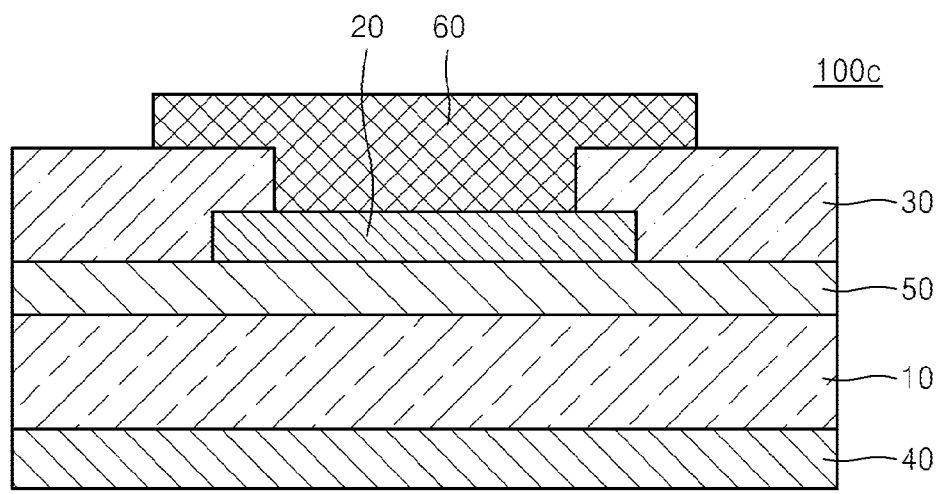

FIGS. 2A through 2C are cross-sectional views of thermistors 100a, 100b, and 100c with 3 terminals, according to embodiments of the present invention.

Referring to FIG. 2A, the thermistor 100a with 3 terminals includes a heat-emitting electrode 40, a substrate 10, a thermistor thin film 20, and electrodes 30.

The substrate 10 is an insulating substrate or a semiconductor substrate such as a silicon substrate. The heat-emitting electrode 40 emits or transmits heat from the thermistor 100a and is formed of a metal material, which transfers heat well, completely on a lower surface of the substrate 10. The thermistor thin film 20 is formed on a portion of the substrate 10 and has a NTC characteristic as described above with reference to FIG. 1. For example, the thermistor thin film 20 may be formed as a semiconductor thin film including group III+V semiconductors, group II+VI semiconductors, graphene and carbon nano-tubes as a carbon compound, a p-n junction diode such as a Si p-n junction diode, $V_2O_5$, p-type GaAs, p-type Ge, and the like. The electrodes 30 are formed on the substrate 10 on both sides of the thermistor thin film 20 so that a voltage may be applied thereto.

Differently from a conventional thermistor with 2 terminals, the thermistor 100a according to the present embodiment further includes the heat-emitting electrode 40, which is formed underneath the substrate 10. Thus, heat is emitted or transmitted through the heat-emitting electrode 40 so as to prevent the thermistor 100a from malfunctioning due to a rise in temperature of the thermistor 100a.

Referring to FIG. 2B, the thermistor 100b with 3 terminals, according to the present embodiment of the present invention, is similar to the thermistor 100a of FIG. 2A except that a buffer layer 50 is further formed of an insulator on the substrate 10, so as to alleviate lattice mismatch between the substrate 10 and the thermistor thin film 20.

Referring to FIG. 2C, the thermistor 100c with 3 terminals, according to the present embodiment of the present invention, is similar to the thermistor 100b of FIG. 2B except that an insulating layer 60 is further formed on a part of the thermistor thin film 20 and a part of the electrodes 30 in order to protect the thermistor thin film 20.

The thermistors 100b and 100c include the heat-emitting electrodes 40 formed on the substrates 10 so as to prevent the thermistors 100b and 100c from malfunctioning due to rises in temperatures of the thermistors 100b and 100c.

Figure 2D:
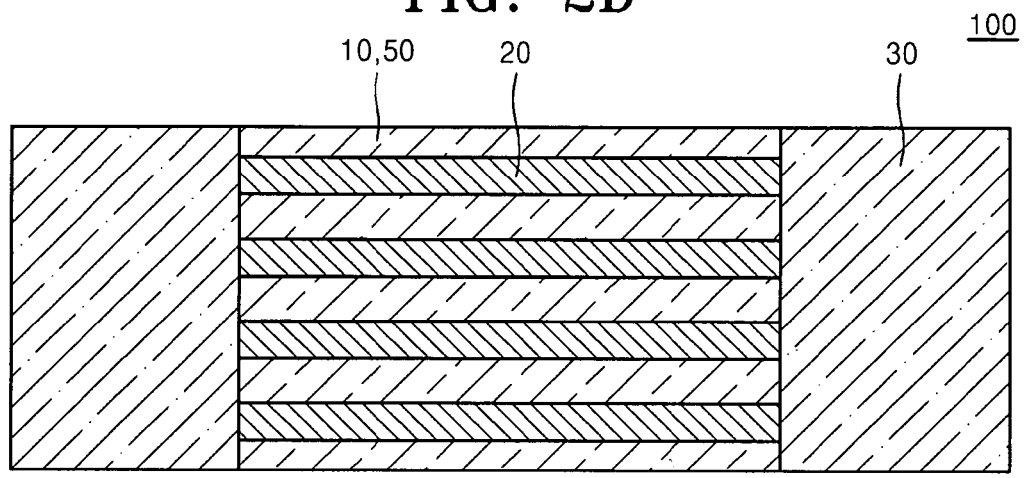
FIG. 2D is a plan view of the thermistor as shown in FIG. 2A or 2B.

FIG. 2D is a plan view of the thermistor 100a or 100b as shown in FIG. 2A or 2B.

Referring to FIG. 2D, the thermistor thin film 20 of the thermistor 100a or 100b is formed on the substrate 10 or the buffer layer 50 and between the electrodes 30, i.e., between first and second electrodes, as described above. As shown in FIG. 2D, the thermistor thin film 20 may have a structure in which at least two rectangular bands are connected in parallel between the first and second electrodes. However, the present invention is not limited thereto. For example, the thermistor thin film 20 may have a structure in which one rectangular band may be connected between the first and second electrodes.

Figure 3:
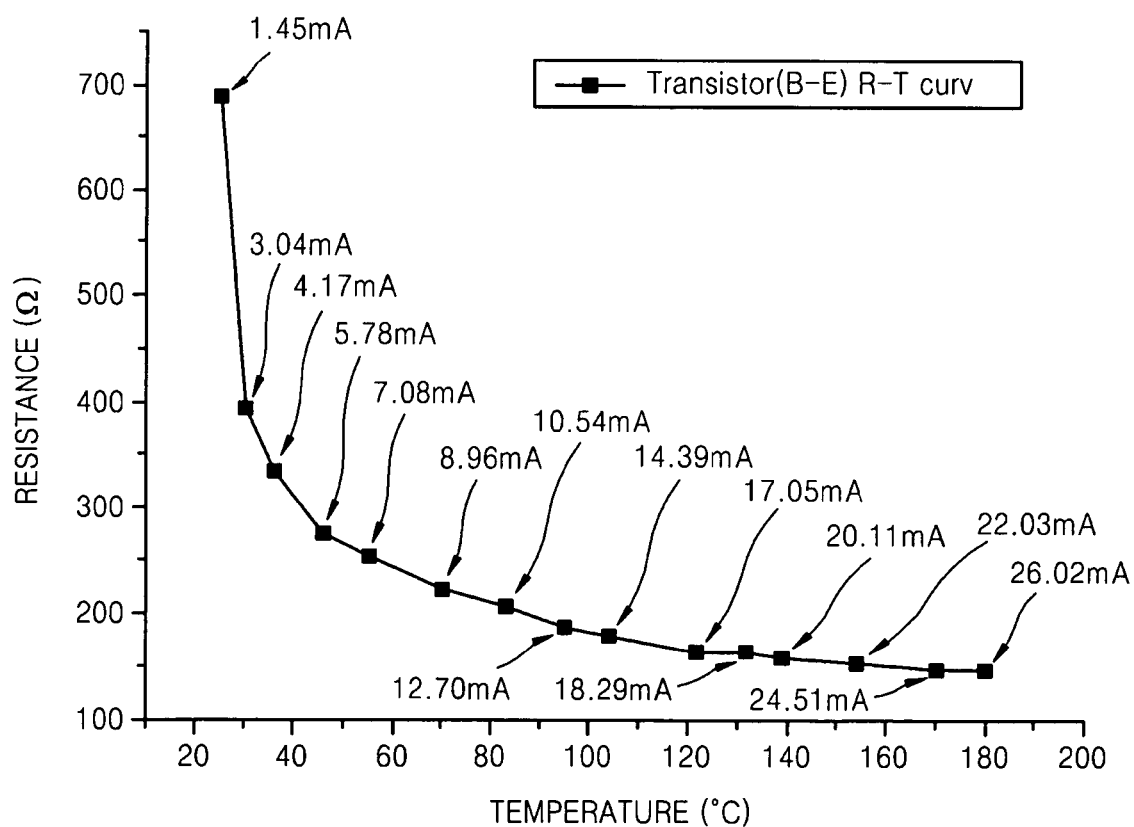
FIG. 3 is a graph illustrating a temperature dependency of the resistance between a base and an emitter of a NPN junction transistor used as a thermistor, according to an embodiment of the present invention.

FIG. 3 is a graph illustrating a temperature dependency of the resistance between a base and an emitter of a NPN junction transistor used as a thermistor, according to an embodiment of the present invention.

Referring to FIG. 3, the resistance of the NPN junction transistor suddenly decreases with temperature at a p-n junction between the base and the emitter of the NPN junction transistor, which is a characteristic of an NTC thermistor as described above. Thus, the p-n junction between the base and the emitter of the NPN transistor may be used as a thermistor.

As shown in FIG. 3, when high current flows in a transistor, in particular, a power transistor, heat is generated between a base and an emitter of the transistor. Thus, a current flowing between the base and the emitter of the transistor gradually increases. As a result, high current suddenly flows into a collector and the emitter of the transistor. The sudden increase in current causes unexpected malfunctioning or faults of a current driving device. Thus, a heat-emitting plate is adhered to a conventional transistor when the conventional transistor is manufactured, and a large aluminum heat-emitting plate is adhered to an outside the conventional transistor so as to transmit heat.

As will be described later with reference to FIG. 5A, in the present invention, a thermistor-transistor is connected to a power transistor in order to prevent the power transistor from heating up. Only a control transistor is directly connected to the power transistor using a thermistor characteristic of the p-n junction between the base and the emitter of the NPN junction transistor in order to prevent the power transistor from heating up, as will be described later with reference to FIG. 10.

Figure 4:
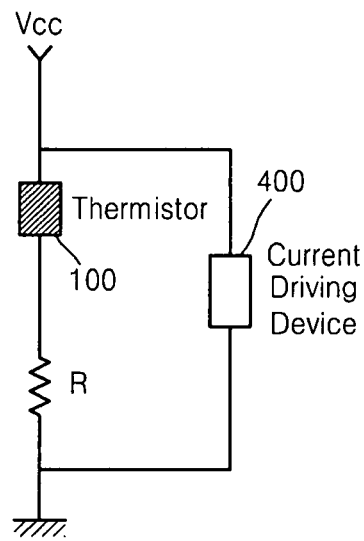
FIG. 4 is a circuit diagram of a thermistor with 3 terminals, according to an embodiment of the present invention.

FIG. 4 is a circuit diagram of a thermistor 100 with 3 terminals, according to an embodiment of the present invention. Here, the thermistor 100 is a thermistor with 3 terminals, including a heat-emitting electrode formed underneath a substrate as described with reference to FIGS. 2A through 2C.

Referring to FIG. 4, the thermistor 100 with 3 terminals according to the present embodiment of the present invention, is connected in series to a resistor "R," and the series combination of the thermistor 100 and the resistor R is connected in parallel to a current driving device 400. According to this arrangement, the thermistor 100 controls a supply of current to the current driving device 400. In other words, when heat is generated from the current driving device 400 due to the supply of over-current to the current driving device 400 or malfunctioning of the current driving device 400, the resistance of the thermistor 100 decreases to bypass the current through the thermistor 100 and protect the current driving device 400. Here, the current driving device 400 may include a high-power light emitting diode (LED) or a diode.

Figure 5A:
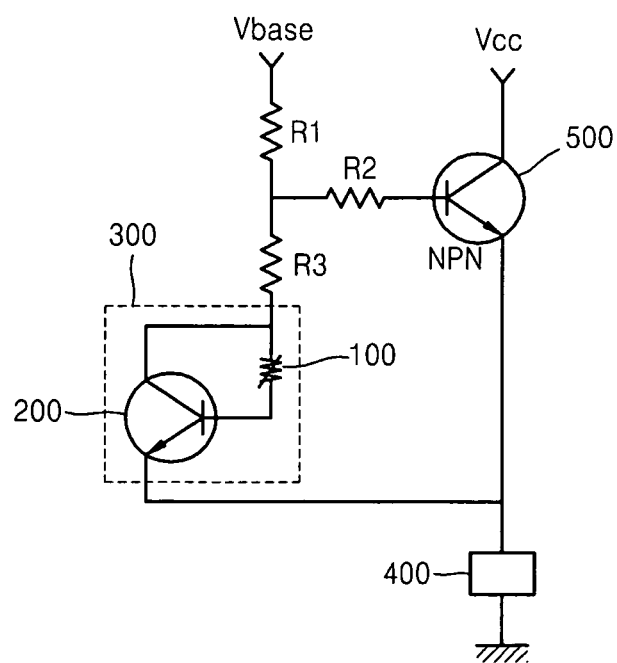
FIGS. 5A and 5B are circuit diagrams of thermistor-transistors according to embodiments of the present invention.
Figure 5B:
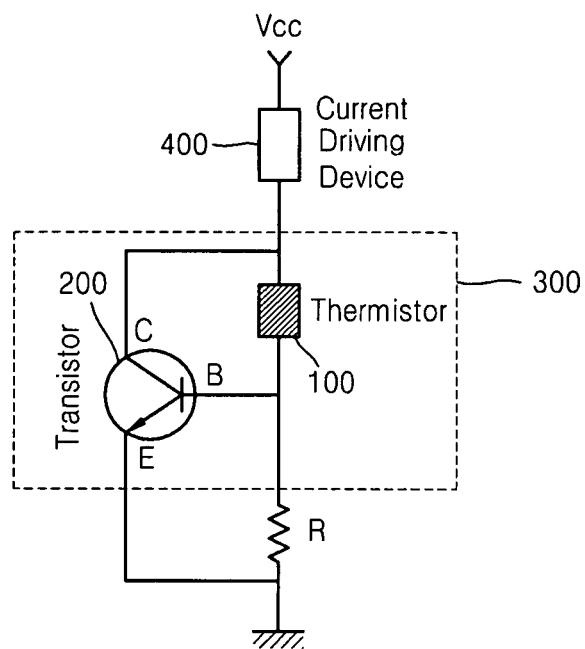

FIGS. 5A and 5B are circuit diagrams of thermistor-transistors 300, according to embodiments of the present invention. Referring to FIG. 5A, the thermistor-transistor 300, according to the present embodiment of the present invention, includes a thermistor 100 and a control transistor 200.

The thermistor 100 corresponds to the thermistor 100a, 100b, or 100c with 3 terminals as described above with reference to FIGS. 2A through 2C and thus includes a heat-emitting electrode so as to have a self-heat emitting function and to be connected to a predetermined terminal of the control transistor 200.

The control transistor 200 may be an NPN-type junction transistor, a PNP-type junction transistor, or a metal-oxide semiconductor (MOS) transistor. If the control transistor 200 is an NPN-type or a PNP-type junction transistor, the thermistor 100 is connected between a base and a collector of the control transistor 200. If the control transistor 200 is the MOS transistor, the thermistor 100 is connected between a gate and a drain of the control transistor 200.

In the present embodiment, a current driving device 400 is connected to a collector of the control transistor 200 but may be connected to an emitter of the control transistor 200, not to the collector of the control transistor 200. A power transistor and a connection between the current driving device 400 and the thermistor-transistor 300 will be described in more detail later with reference to FIGS. 6 through 9B. A resistor R is connected between the emitter and the base of the control transistor 200.

A function of the thermistor-transistor 300 will now be described in brief. If the resistance of the thermistor 100 is high due to a low ambient temperature, most of a voltage is applied to the thermistor 100. A voltage applied to the resistor R, i.e., a voltage applied between the emitter and the base of the control transistor 200, is low. Thus, the control transistor 200 remains off. However, if the resistance of the thermistor 100 is lowered due to an increase in the ambient temperature, much of the voltage is applied to the resistor R. Thus, the control transistor 200 is turned on to allow a current to flow in the control transistor 200.

Meanwhile, the function of the thermistor-transistor 300 will be described with reference to current flowing into the control transistor 200. When the ambient temperature is low, the resistance of the thermistor 100 is high. Thus, a current flowing in the base of the control transistor 200 is low. As a result, the current hardly flows between the collector and the emitter of the control transistor 200. However, when the ambient temperature increases, the resistance of the thermistor 100 connected to the base of the control transistor 200 decreases. Thus, the current flowing in the base of the control transistor 200 increases. As a result, about 100 times or more of high current flows between the collector and the emitter of the control transistor 200.

In the thermistor-transistor 300 of the present embodiment, a current flowing between the collector and the emitter of the control transistor 200 increases in proportion to the current which flows in the base of the control transistor 200. Thus, the resistance of the thermistor 100 continuously varies. As a result, the current flowing between the collector and the emitter of the control transistor 200 continuously varies. In other words, the thermistor-transistor 300 of the present embodiment continuously increases the current flowing between the collector and the emitter of the control transistor 200 with the continuous increase in the ambient temperature.

The thermistor-transistor 300 performing the above-described function may be connected to a power transistor so as to efficiently prevent the power transistor from generating heat.

Referring to FIG. 5B, the thermistor-transistor 300 of the present embodiment is similar to the thermistor-transistor 300 of FIG. 5A except that the current driving device 400 is connected to the thermistor-transistor 300 in parallel. Therefore, the thermistor-transistor 300 of the present embodiment is used to bypass a current in order to protect the current driving device 400, like the thermistor 100 shown in FIG. 4. Here, the current driving device 400 may include a high-power LED or a diode.

FIGS. 6 through 9B are circuit diagrams of circuits for controlling heat of NPN power transistors 500 including thermistor-transistors 300, according to embodiments of the present invention.

Figure 6:
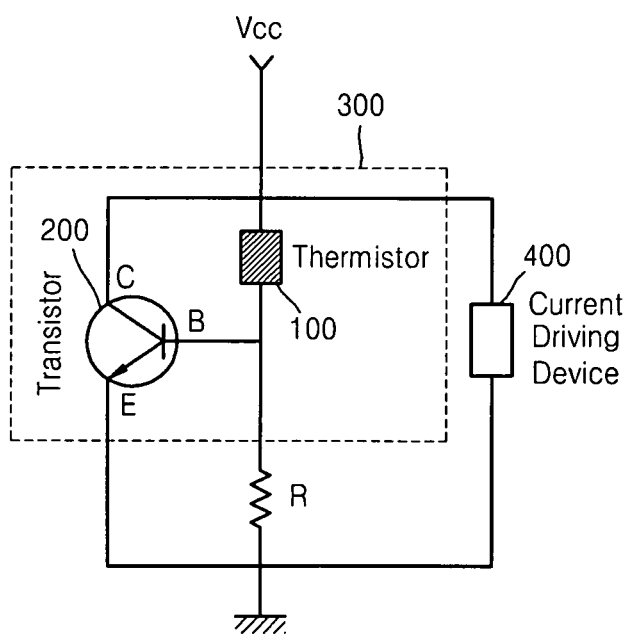
FIGS. 6 through 9B are circuit diagrams for controlling heat of NPN power transistors including thermistor-transistors, according to embodiments of the present invention.

Referring to FIG. 6, the circuit includes the thermistor-transistor 300 and the NPN power transistor 500.

The thermistor-transistor 300 includes the thermistor 100 and the control transistor 200 as described with reference to FIG. 5A. Here, the thermistor 100 is a thermistor with 3 terminals, including a heat-emitting electrode formed underneath a substrate as described with reference to FIGS. 2A through 2C. The thermistor-transistor 300 is connected between a base and an emitter of the NPN power transistor 500.

The NPN power transistor 500 is connected to a power supply "Vcc" and the current driving device 400 to supply a current to the current driving device 400. However, as previously described, the NPN power transistor 500 oversupplies current to the current driving device 400 due to the heat generation of the NPN power transistor 500 and thus frequently causes faults or malfunctioning of the current driving device 400. The heat-emitting plate is adhered to the conventional power transistor, and the large aluminum heat-emitting plate is adhered to an outside the conventional power transistor in order to manufacture the conventional power transistor so as to prevent the power transistor from heating up. Thus, the conventional power transistor is very disadvantageous in terms of size and cost. However, in the present embodiment, a thermistor-transistor is connected between a base and an emitter of a power transistor instead of adhering a heat-emitting plate to the power transistor so as to solve the heat generation problem of the power transistor.

Here, resistors "R1," "R2," and "R3" control currents or voltages applied to the base of the NPN power transistor 500 and the thermistor-transistor 300, and a user may appropriately control the resistance values of the resistors "R1," "R2," and "R3." Only the NPN power transistor 500 is shown in FIG. 6 but present embodiment is not limited thereto. In other words, a PNP transistor, a MOS transistor, a photodiode (or a photo transistor) using light incident onto a base terminal, a photo relay, a photo silicon controlled rectifier (SCR), an insulated-gate bipolar transistor (IGBT), a SCR, a triac, or the like may be used as a power transistor.

A function of the circuit for controlling the heat of the NPN power transistor 500 according to the present embodiment will now be described.

When the NPN power transistor 500 supplies current to the current driving device 400, heat is generated from the NPN power transistor 500, which increases an ambient temperature. Thus, the resistance of the thermistor 100 of the thermistor-transistor 300 decreases. As a result, much of a current applied from a base voltage "$V_{base}$" flows between the emitter and the collector of the control transistor 200. Therefore, the current flowing in the NPN power transistor 500 decreases, and thus the current flowing between the collector and the emitter of the NPN power transistor 500 decreases. Thus, the generation of heat of the NPN power transistor 500 stops, which lowers the ambient temperature. In more detail, when the temperature of a power transistor increases, a base current of the power transistor continuously decreases due to the thermistor-transistor 300. The decrease in the base current of the power transistor reaches a limit and the temperature of the power transistor does not increase any more in a moderately high temperature that is in a range between about 80° C. and 100° C.

Here, the thermistor 100 may be adhered to the collector of the NPN power transistor 500, which generates the most amount of heat, in order to effectively prevent the NPN power transistor 500 from heating up. The control transistor 200 of the thermistor-transistor 300 compensates for the current which has decreased in the NPN power transistor 500 and supplies current to the current driving device 400.

Figure 7:
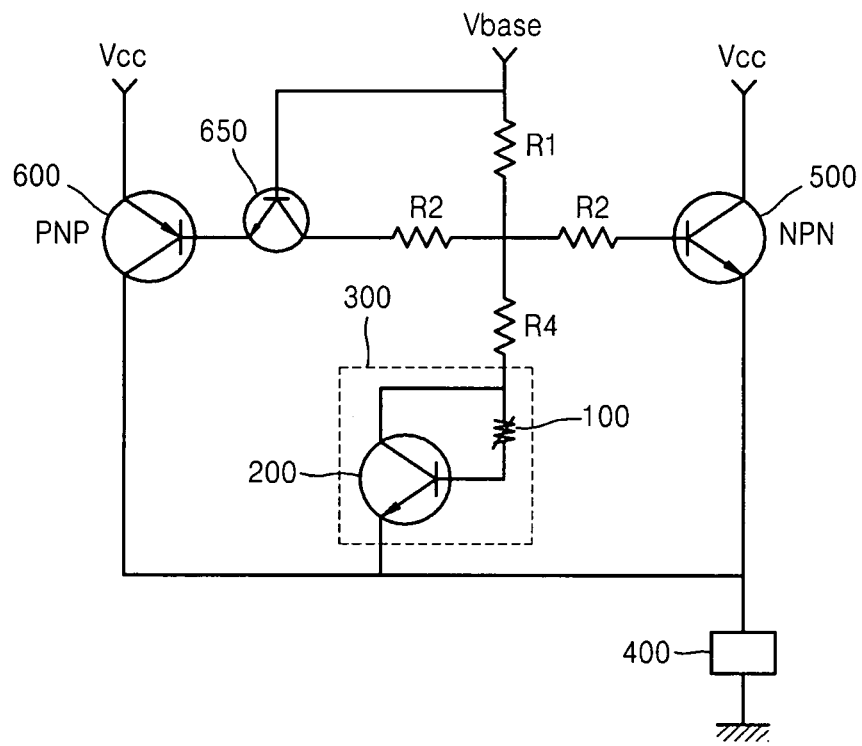

Referring to FIG. 7, the circuit for controlling heat of the NPN power transistor 500 according to the present embodiment has a different structure from the circuit of FIG. 6. In other words, a PNP power transistor 600 is further connected between the power supply "Vcc" and the current driving device 400, and the thermistor-transistor 300 is connected between a common base of the NPN power transistor 500 and the PNP power transistor 600 and an output terminal.

Here, resistors "R1," "R2," "R3," and "R4" control a current or a voltage applied to the bases of the NPN and PNP power transistors 500 and 600 and the thermistor-transistor 300, and a user may appropriately control the resistance values of the resistors "R1," "R2," "R3," and "R4." A trigger transistor 650 is further connected to the base of the PNP power transistor 600 so as to further accurately control turning on and turning off of the PNP power transistor 600. However, the trigger transistor 650 may be omitted if necessary.

A function of the circuit for controlling heat of the NPN power transistor 500 according to the present embodiment will now be described.

If the NPN power transistor 500 does not generate heat, a current is supplied to the current driving device 400 only through the NPN power transistor 500.

In other words, since the current does not flow into the base of the PNP power transistor 600 due to the trigger transistor 650, the PNP power transistor 600 remains off. Also, since the temperature of the thermistor-transistor 300 is low, a current hardly flows in the thermistor-transistor 300 through the control transistor 200. Otherwise, if the NPN power transistor 500 generates heat, and thus the temperature of the NPN power transistor 500 becomes high, the thermistor-transistor 300 operates to allow the current to flow in the control transistor 200 as described with reference to FIG. 6. A voltage applied to intersections among resistors is relatively lowered, and thus a current flows in the PNP power transistor 600 through the trigger transistor 650. Thus, the PNP power transistor 600 is turned on, and the current flows in the PNP power transistor 600. Therefore, the thermistor-transistor 300 and the PNP power transistor 600 compensate for the current which has decreased in the NPN power transistor 500 and supply current to the current driving device 400.

If the temperature of the NPN power transistor 500 is lowered due to the above-described operation, the current state returns to the initial state, i.e., the thermistor-transistor 300 and the PNP power transistor 600 stop operating and the NPN power transistor 500 normally operates to supply a current to the current driving device 400.

Figure 8:
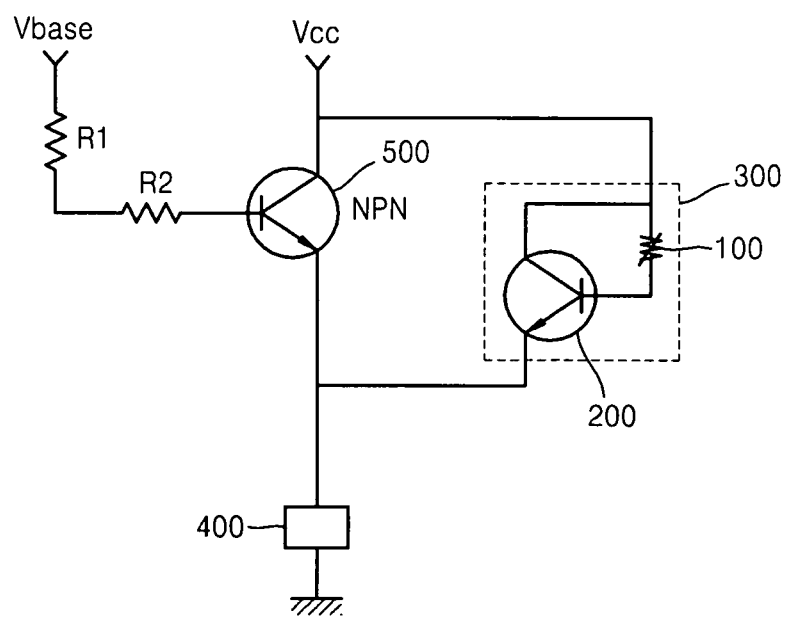

Referring to FIG. 8, the circuit for controlling heat of the NPN power transistor 500 according to the present embodiment is similar to the circuit of FIG. 6 except that the thermistor-transistor 300 is connected to the NPN power transistor 500. In other words, in the present embodiment, the thermistor-transistor 300 is connected between the collector and the emitter of the NPN power transistor 500, not between the base and the emitter of the NPN power transistor 500.

The operation of the circuit of the present embodiment is similar to that of the circuit of FIG. 6. In other words, if the temperature of the NPN power transistor 500 rises, the thermistor-transistor 300 operates so as to bypass a current generated from the power supply "Vcc." Thus, the current flowing in the NPN power transistor 500 decreases so as to prevent the NPN power transistor 500 from generating heat. In general, since a large amount of heat is generated from a collector of a power transistor, a connection of a thermistor-transistor to the collector of the power transistor as in the present embodiment is more efficient, and helpful to constitute an integrated circuit (IC).

A junction transistor is exemplarily illustrated in the present embodiment, but the present invention is not limited thereto. In the case of a power transistor using a MOS transistor, the thermistor-transistor 300 may be connected between a source and a drain of the power transistor so as to perform the same function.

Figure 9A:
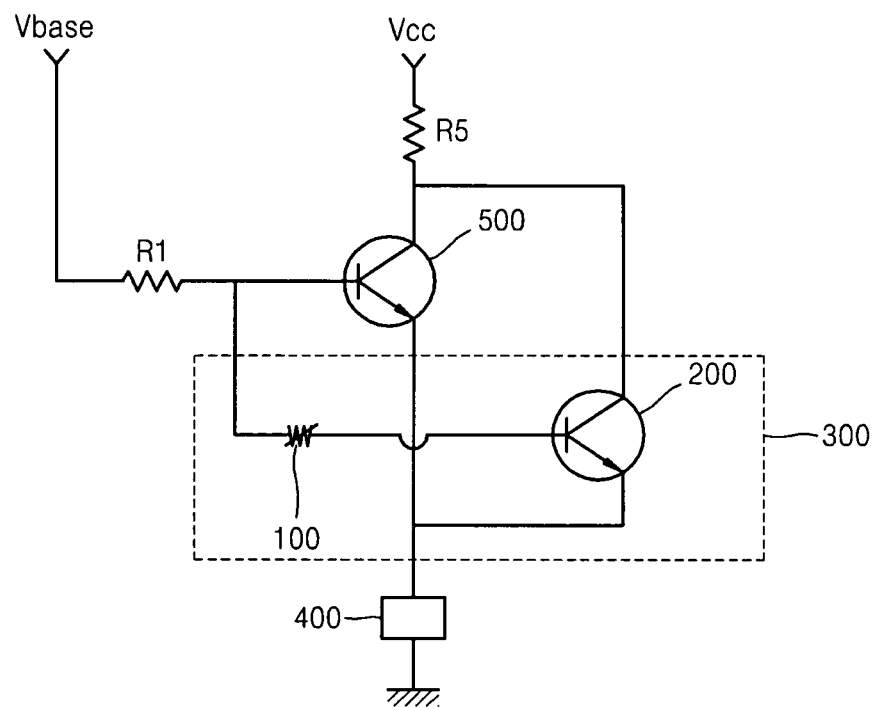

Referring to FIG. 9A, the circuit for controlling heat of a power transistor according to the present embodiment is different from the circuit of FIG. 6 in that the thermistor-transistor 300 is differently connected. In other words, a base of a power transistor 500 is connected to a base of the control transistor 200 through the thermistor 100, and a collector and an emitter of the power transistor 500 are respectively connected to a collector and an emitter of the control transistor 200.

The circuit of the present embodiment operates using the above-described connection relation as follows. A temperature of the thermistor 100 rises, and the resistance of the thermistor 100 is lowered with an increase in temperature caused by the heat generation of the power transistor 500. Thus, a base current applied to the base of the power transistor 500 decreases, and a current flowing between the collector and the emitter of the power transistor 500 decreases. As a result, the temperature of the power transistor 500 is lowered. The control transistor 200 is turned on, and thus a current flows between the collector and the emitter of the control transistor 200. Thus, the control transistor 200 compensates for the current that has decreased in the power transistor 500 so that the current flowing in the current driving device 400 hardly decreases. When the resistance of the thermistor 100 rises with a decrease in the temperature of the power transistor 500, the control transistor 200 is turned off, and a current is supplied to the current driving device 400 only through the power transistor 500.

The circuit of the present embodiment may uniformly supply current to the current driving device 400 and effectively prevent the power transistor 500 from heating up. In the present embodiment, junction transistors are exemplarily used as a power transistor and a control transistor. However, MOS transistors may be used as the power transistor and the control transistor. The resistor "R1" is connected between the base voltage "$V_{base}$" and a base of the power transistor, and the resistor "R2" is connected between the power supply "Vcc" and a collector of the power transistor. However, appropriate resistors may be further connected among devices. For example, a resistor may be connected between the thermistor 100 and the base of the power transistor 500.

Figure 9B:
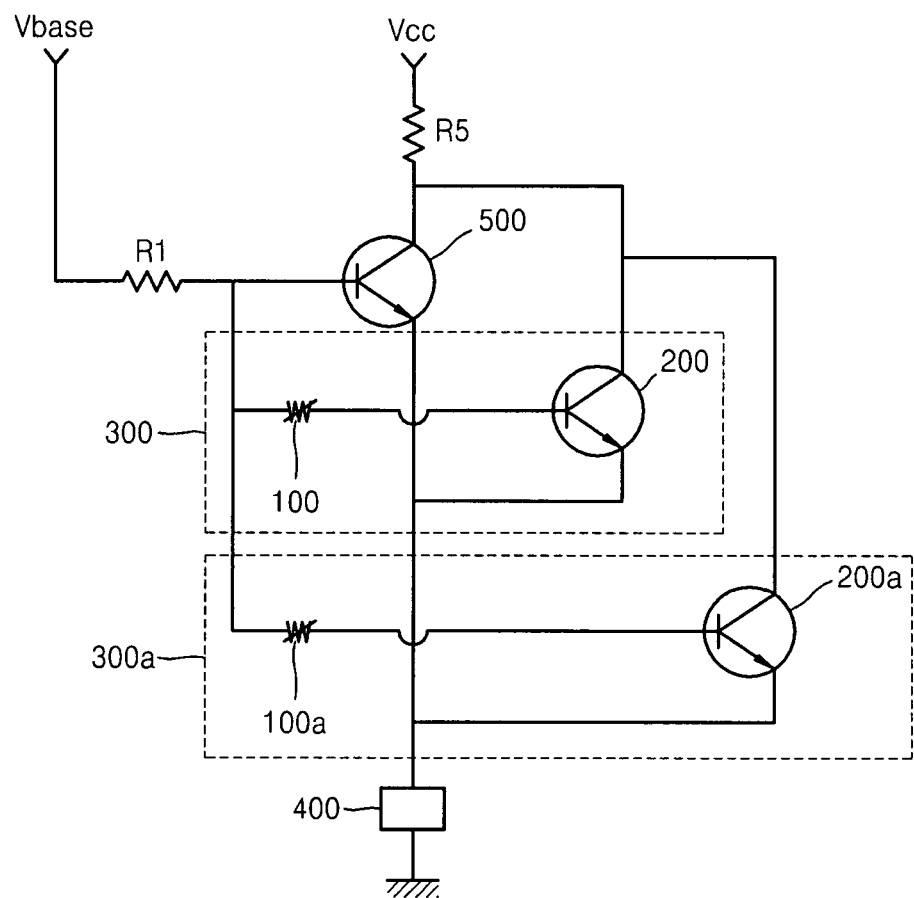

Referring to FIG. 9B, the circuit for controlling heat of a power transistor 500 further includes a second thermistor-transistor 300a which is connected to the power transistor 500 in parallel. Due to the second thermistor-transistor 300a, the circuit controls heat of the power transistor 500 and heat of the control transistor 200 of the thermistor-transistor 300. In other words, in the circuit of the present embodiment two thermistor-transistors prevent the power transistor 500 from heating up, and one thermistor-transistor prevents the other thermistor-transistor from heating up. Two thermistor-transistors are shown in FIG. 9B, however more than two thermistor-transistors may be connected to the power transistor 500 in parallel.

Figure 10:
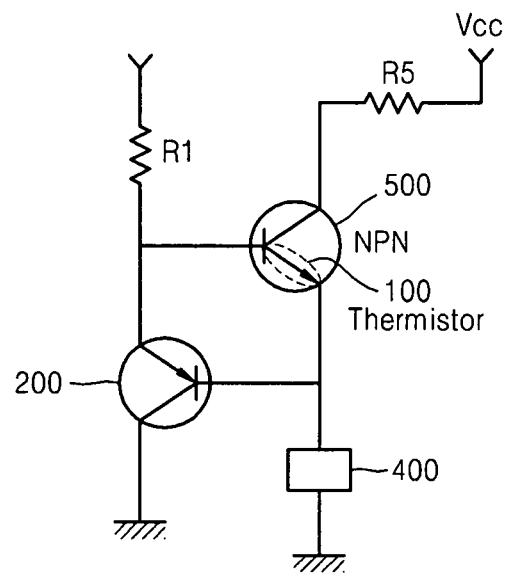
FIG. 10 is a circuit diagram for controlling heat of an NPN power transistor using a p-n junction of a junction transistor, according to another embodiment of the present invention.

FIG. 10 is a circuit diagram for controlling heat of a power transistor 500 using a p-n junction of a junction transistor, according to another embodiment of the present invention.

In the above-described previous embodiments, the thermistor-transistor 300 uses a thermistor with 3 terminals, including a thermistor thin film as shown in FIGS. 2A through 2C, as the thermistor 100. However, a p-n junction of a transistor may be used as a thermistor as described with reference to FIG. 3. In the present embodiment, a thermistor-transistor is realized using a p-n junction of a junction transistor as a thermistor.

Referring to FIG. 10, the circuit of the present embodiment includes the NPN power transistor 500 and the control transistor 200. A p-n junction 100 (a circle marked with a dotted line) between a base and an emitter of the NPN power transistor 500 operates as a thermistor. Thus, the p-n junction 100 of the NPN power transistor 500 and the control transistor 200 constitute a thermistor-transistor as previously described. A function of the circuit of the present embodiment is the same as that of the circuit of FIG. 6.

In other words, a temperature of the NPN power transistor 500 increases a temperature due to heat generation of the NPN power transistor 500 and a current flowing between the base and the emitter of the NPN power transistor 500 increases. Thus, a current flowing in the control transistor 200 also increases, and a current flowing in the base of the NPN power transistor 500 decreases. As a result, a current flowing in a collector of the NPN power transistor 500 decreases so as to prevent the NPN power transistor 500 from heating up.

Figure 11A:
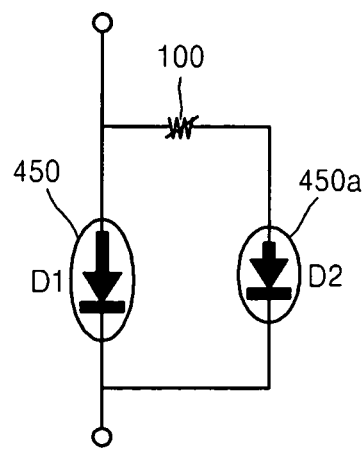
FIGS. 11A and 11B are circuit diagrams for controlling heat of first and second power diodes according to embodiments of the present invention.
Figure 11B:
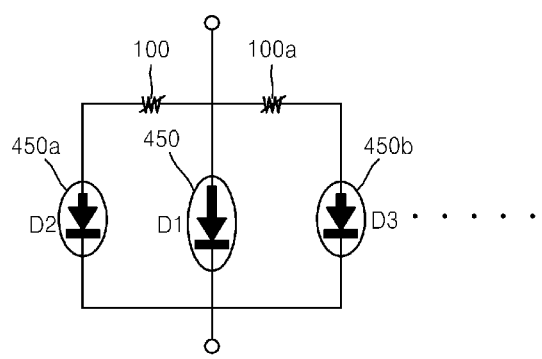

FIGS. 11A and 11B are circuit diagrams for controlling heat of first and second power diodes 450 and 450a, according to embodiments of the present invention.

Referring to FIG. 11A, the circuit of the present embodiment includes the thermistor 100 connected in series with the second diode 450a, and the series combination of the thermistor 100 and the second diode 450a connected in parallel to the first diode 450. The circuit of the present embodiment controls a supply of current that is applied to the first and second diodes 450 and 450a through the thermistor 100. In FIG. 11A, an arrow of the second diode 450a connected to the thermistor 100 is shorter than that of the first diode 450, indicating the thermistor 100 operates as a resistor that is to be supplied with a small amount of current. When the first diode 450 generates heat, the resistance of the thermistor 100 is lowered. Thus, a relatively large amount of current is supplied to the second diode 450a.

In the present embodiment, the circuit has been described in relation to a thermistor with 3 terminals. However, another device capable of controlling current may be connected instead of the thermistor with 3 terminals. For example, a metal-insulator transition (MIT) device, a resistor having its resistance varying with temperature, or the like may be connected instead of the thermistor with 3 terminals. Alternatively, the resistor may not be connected. Although not shown in FIG. 11A, a power supply and a ground may be respectively connected to upper and lower terminals.

Here, the first and second diodes 450 and 450a may be a p-n junction diode and may include an LED. The LED may be all types of illumination devices using an LED, like an LED light bulb or a fluorescent lamp.

Referring to FIG. 11B, a circuit for controlling heat of a power diode according to the present embodiment is similar to the circuit of FIG. 11A except that two or more thermistors with 3 terminals and three or more diodes are connected. In other words, diodes are connected in parallel to respectively correspond to thermistors with 3 terminals. Thus, the number of diodes is one greater than that of the thermistors. A function of the circuit of the present embodiment is the same as that of the circuit of FIG. 11A, and other devices, i.e., MIT devices or resistors controlling a current, may be connected instead of the thermistors.

Each of the circuits of FIGS. 11A and 11B may be packaged in one chip. If the circuit uses LEDs as diodes, the circuit and a light-transmitting lens may be packaged in one chip so as to realize a low heat LED device. The circuit may be usefully applied to various types of power systems such as a power illumination system, a high-power supply system, and the like.

Figure 12:
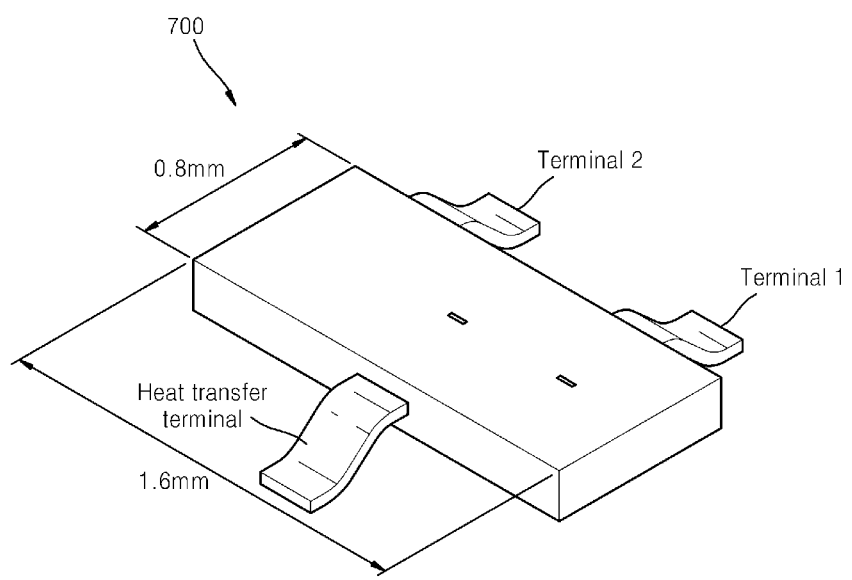
FIG. 12 is a perspective view of the thermistor of FIGS. 2A through 2C which is packaged into one chip, according to an embodiment of the present invention.

FIG. 12 is a perspective view of the thermistor 100a, 100b, or 100c of FIGS. 2A through 2C which is packaged in one chip 700. Referring to FIG. 12, the thermistor 100, 100b, or 100c as shown in FIGS. 2A through 2C may be packaged in one micro-miniature chip having a width of about 0.8 mm and a length of about 1.6 mm. However, the size of the thermistor 100a, 100b, or 100c packaged in one chip is not limited thereto. If the thermistor 100a, 100b, or 100c is packaged in one chip, external terminals are formed outside the chip. In detail, first and second terminals are respectively connected to plus and minus electrodes of the electrodes 30 of FIGS. 2A through 2C, and a heat transfer terminal is connected to the heat-emitting electrode 40 of FIGS. 2A through 2C and is electrically separated from the first and second terminals.

Figure 13A:
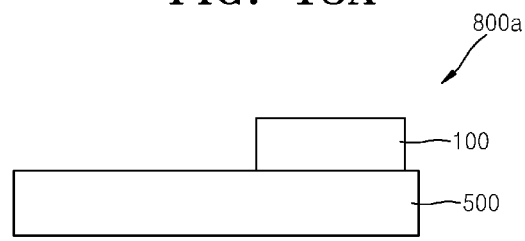
FIGS. 13A through 13C are a cross-sectional view and plan views illustrating an arrangement relation between transistors and a thermistor which are arranged when the circuits of FIGS. 6 through 10 are integrated into one chip.
Figure 13B:
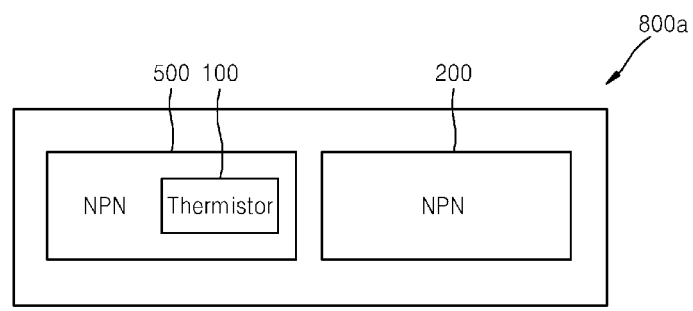
Figure 13C:
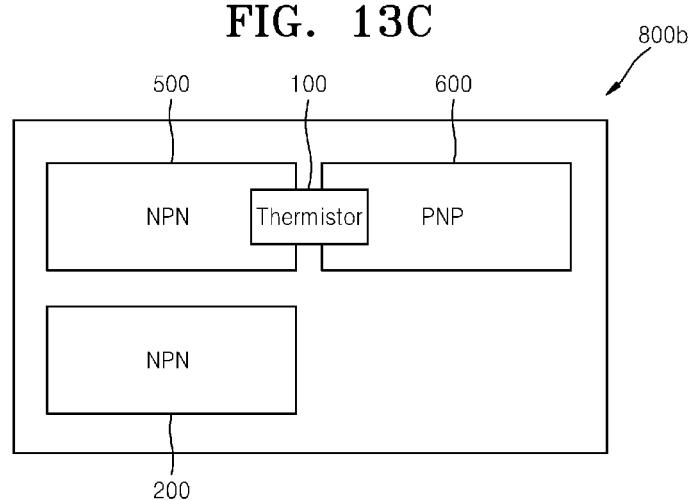

FIGS. 13A through 13C are diagrams illustrating an arrangement between power transistors 500 and a thermistor 100 when each of the circuits of FIGS. 6 through 10 is integrated in one chip.

It has been described with reference to FIG. 12 that the thermistor 100a, 100b, or 100c is packaged in one chip. However, each of the circuits of FIGS. 6 through 10 including the thermistor 100a, 100b, or 110c may be packaged in one chip. A position relation between the thermistor 100 and the power transistors 500 that are packaged as described above will now be described.

FIG. 13A is a cross-sectional view illustrating a position relation between the power transistor 500 and the thermistor 100. When a circuit 800a for controlling heat of the power transistor 500 is packaged, the thermistor 100 may be positioned on part of the power transistor 500. A heat temperature of the power transistor 500 may be further accurately sensed when the thermistor 100 is positioned near to the power transistor 500. Thus, a thermistor-transistor may operate so as to further effectively control heat of the power transistor 500.

FIG. 13B is a plan view of a packaged circuit 800 for controlling heat of the power transistor 500 to illustrate position relations among the thermistor 100, the power transistor 500, and the control transistor 200. The thermistor 100 is disposed on the power transistor 500.

FIG. 13C is a plan view of a circuit 800b for controlling heat of a NPN power transistor 500. Here, the circuit 800b further includes a PNP power transistor 600. In this case, the thermistor 100 is disposed on the NPN power transistor 500 and the PNP power transistor 600. If heat of only one of the NPN and PNP power transistors 500 and 600 becomes a problem, the thermistor 100 may be disposed only on the one of the NPN and PNP power transistors 500 and 600.

In the above-described embodiments, structures and functions of circuits for controlling heat of a power transistor and circuits for controlling heat of a power diode have been described. The circuits may be usefully applied to various types of power systems including current driving devices. For example, the circuits may be applied to a power controlling circuit of a cellular phone, a computer, a battery charging circuit, a motor controlling circuit, a power amp, and an electrical and electronic device and a control circuit system of a power supply, an IC, an LED light bulb, an LED fluorescent lamp, and an LED illumination device. Each of the circuits may be packaged in one chip to easily access a current driving power system.

As described above, a thermistor with 3 terminals according to the present invention includes heat-emitting electrodes to prevent the thermistor from heating up and is semi-permanently used without being replaced. Thus, waste of time and cost caused by the use of a fuse is solved. Also, a thermistor-transistor including the thermistor with the 3 terminals is connected to a power transistor so as to effectively prevent the power transistor from heating up.

In addition, a circuit for controlling heat of a power transistor using a thermistor-transistor prevents the power transistor from malfunctioning due to an excessive increase in temperature of the power transistor. Thus, the circuit stably protects a device or system which is supplied with power through the power transistor. For example, the circuit may be applied to all types of electrical and electronic circuits such as a power controlling circuit of a cellular phone, a notebook computer, a battery charging circuit, a motor controlling circuit, and an electrical and electronic device, a power supply, and a power amp using a power transistor.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A circuit for controlling heat of a power transistor, comprising:

a thermistor-transistor integrated into one chip, which comprises a thermistor having a resistance decreasing with an increase in temperature and a control transistor, wherein the thermistor is connected between two terminals of the control transistor; and at least one power transistor which is connected to a driving device to control a supply of power to the driving device, wherein the thermistor-transistor is adhered to one of a surface and a heat-emitting part of the at least one power transistor and is connected to one of a base, a gate, a collector, and a drain of the at least one power transistor to decrease or block a current flowing in the at least one power transistor when the temperature of the at least one power transistor rises, so as to prevent the at least one power transistor from heating up.

2. The circuit of claim 1, wherein the at least one power transistor comprises one of a NPN-type junction transistor, a PNP-type junction transistor, a MOS transistor, a photodiode (or a photo transistor) using light incident onto a base terminal, a photo relay, a photo SCR (silicon controlled rectifier), an IGBT (insulated-gate bipolar transistor), a SCR, and a triac.

3. The circuit of claim 1, wherein if the at least one power transistor is a junction transistor, the thermistor-transistor is connected between a base and an emitter of the at least one power transistor or between a collector and the emitter of the at least one power transistor, or if the at least one power transistor is a MOS transistor, the thermistor-transistor is connected between a gate and a source of the at least one power transistor or between a drain and the source of the at least one power transistor.

4. The circuit of claim 1, wherein the at least one power transistor is integrated into the one chip.

5. The circuit of claim 4, wherein the thermistor is disposed on the least one power transistor.

6. A circuit for controlling heat of a power transistor, comprising:

a thermistor-transistor which comprises a thermistor having a resistance decreasing with an increase in temperature and a control transistor connected to the thermistor; and at least one power transistor which is connected to a driving device to control a supply of power to the driving device, wherein the thermistor-transistor is adhered to one of a surface and a heat-emitting part of the at least one power transistor and is connected to one of a base, a gate, a collector, and a drain of the at least one power transistor to decrease or block a current flowing in the at least one power transistor when the temperature of the at least one power transistor rises, so as to prevent the at least one power transistor from heating up, wherein the circuit comprises two power transistors which have opposite polarities and are connected to each other through one of a common base and a common gate, wherein the thermistor-transistor is commonly connected between one of the common base and the common gate and output terminals of the two power transistors, a first power transistor of the two power transistors is turned on to supply a current to the driving device, a second power transistor remains off, the thermistor-transistor decreases or blocks the current of the first power transistor when the temperature of the first power transistor rises, and the second power transistor is turned on to allow the current to flow so as to prevent the first power transistor from heating up.

7. The circuit of claim 6, wherein if the temperature of the first power transistor drops or a temperature of the second power transistor rises, the thermistor-transistor turns off the second power transistor and allows a normal current to flow in the first power transistor.

8. The circuit of claim 6, wherein a trigger transistor is connected to a base of the second power transistor.

9. The circuit of claim 6, wherein a combination of the two power transistors is one of a combination of two junction transistors, a combination of two MOS transistors, and a combination of a junction transistor and a MOS transistor.

10. A circuit for controlling heat of a power transistor, comprising:

a thermistor-transistor which comprises a thermistor having a resistance decreasing with an increase in temperature and a control transistor connected to the thermistor; and at least one power transistor which is connected to a driving device to control a supply of power to the driving device, wherein the thermistor-transistor is adhered to one of a surface and a heat-emitting part of the at least one power transistor and is connected to one of a base, a gate, a collector, and a drain of the at least one power transistor to decrease or block a current flowing in the at least one power transistor when the temperature of the at least one power transistor rises, so as to prevent the at least one power transistor from heating up, wherein:

one of a base and a gate of the control transistor is connected to one of the base and the gate of the at least one power transistor through the thermistor, one of an emitter and a source of the control transistor is connected to one of the emitter and the source of the at least one power transistor, and one of a collector and a drain of the control transistor is connected to one of the collector and the drain of the at least one power transistor; and when the at least one power transistor is turned on to supply the current to the driving device and the temperature of the at least one power transistor rises, the thermistor-transistor decreases or blocks the current of the at least one power transistor and allows a current to flow in the control transistor so as to prevent the at least one power transistor from heating up.

11. The circuit of claim 10, wherein the thermistor comprises at least one of a thermistor with 3 terminals, a MIT (metal-insulator transition) device and a resistor having a resistance varying with temperature.

12. The circuit of claim 10, wherein at least two thermistor-transistors are connected to the at least one power transistor in parallel, and control transistors of the at least two thermistor-transistors are respectively equally connected to the thermistor of the at least two thermistor-transistors and the at least one power transistor.

13. The circuit of claim 1, wherein the thermistor is formed using a p-n junction of a junction transistor, wherein the junction transistor is used as the at least one power transistor.

14. A circuit for controlling heat of a power diode, comprising:

the power diode which comprises a first power diode and at least one second power diode connected to the first power diode in parallel and in a same polarity; and a current controlling device which is connected between the first power diode and the at least one second power diode, wherein a portion of large current flowing in the first power diode flows to the at least one second power diode through the current controlling device so as to control heat of the first power diode.

15. The circuit of claim 14, wherein the current controlling device comprises at least one of a thermistor, a MIT device and a resistor having a resistance varying with temperature.

16. The circuit of claim 14, wherein the circuit is packaged in one chip.

17. The circuit of claim 14, wherein the power diode is a LED, and the circuit is packaged with a light-transmitting lens.

18. The circuit of claim 14, wherein the power diode is a p-n junction diode and comprises one of an LED light bulb and an LED fluorescent lamp.

19. A power system comprising the circuit of claim 1.

20. The power system of claim 19, wherein the power system is one of a power controlling circuit of a cellular phone, a computer, a battery charging circuit, a motor controlling circuit, a power amp, and an electrical and electronic device and a control circuit system of a power supply, an IC (integrated circuit), an LED light bulb, an LED fluorescent lamp, and an LED illumination.

21. A power system comprising the circuit of claim 14.

* * * * *